(12) United States Patent
Chao et al.

(10) Patent No.: US 9,947,893 B2
(45) Date of Patent: Apr. 17, 2018

(54) ORGANIC LIGHT-EMITTING DIODE DISPLAY

(71) Applicant: InnoLux Corporation, Miao-Li County (TW)

(72) Inventors: Kuang-Pin Chao, Miao-Li County (TW); Chia-Chun Liu, Miao-Li County (TW); Chao-Hsiang Wang, Miao-Li County (TW); Yi-Ching Chen, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 110 days.

(21) Appl. No.: 15/200,056

(22) Filed: Jul. 1, 2016

(65) Prior Publication Data
US 2017/0084865 A1    Mar. 23, 2017

(30) Foreign Application Priority Data
Sep. 17, 2015   (TW) .............................. 104130742 A

(51) Int. Cl.
*H01L 29/08*    (2006.01)
*H01L 51/52*    (2006.01)

(52) U.S. Cl.
CPC ...... *H01L 51/5246* (2013.01); *H01L 51/5237* (2013.01)

(58) Field of Classification Search
CPC .................. H01L 51/5246; H01L 51/5237

USPC ........................................................... 257/40
See application file for complete search history.

(56) References Cited

U.S. PATENT DOCUMENTS

| | | | |
|---|---|---|---|
| 2009/0233514 A1* | 9/2009 | Lee ........................ | B32B 37/065 445/25 |
| 2014/0038327 A1* | 2/2014 | Lee ........................ | B23K 1/0056 438/28 |
| 2015/0255747 A1 | 9/2015 | Huang et al. | |

FOREIGN PATENT DOCUMENTS

CN    103779503    5/2014

OTHER PUBLICATIONS

Chinese language office action dated Jun. 8, 2016, issued in application No. TW 104130742.

* cited by examiner

*Primary Examiner* — Long K Tran
(74) *Attorney, Agent, or Firm* — McClure, Qualey & Rodack, LLP

(57) ABSTRACT

An organic light-emitting diode display is provided. The organic light-emitting diode display includes a first substrate, a second substrate, a frit, a metal layer, and an insulating layer. The second substrate is arranged to be separated from the first substrate. The frit is located between the first and second substrates. The metal layer is disposed on the first substrate, and the frit is located on the metal layer. The metal layer includes at least one opening. The frit is located in the opening. The frit has a number of voids arranged to correspond to the opening.

10 Claims, 10 Drawing Sheets

ORGANIC LIGHT-EMITTING DIODE DISPLAY

CROSS REFERENCE TO RELATED APPLICATIONS

This Application claims priority of Taiwan Patent Application No. 104130742, filed on Sep. 17, 2015, the entirety of which is incorporated by reference herein.

BACKGROUND

Field of the Invention

The disclosure relates to a display device, and in particular it relates to an organic light-emitting diode display device.

Description of the Related Art

An organic light-emitting diode (OLED) refers to a semiconductor device which is capable of converting electric energy into light energy and has such advantages as self-luminescence, slimness, high contrast, short response time (within a few microseconds), wide viewing angles, low power consumption, wide working temperature ranges, panel flexibility, and so forth. Hence, the OLED is frequently applied to a number of electronic products.

However, the performance of the OLED can suffer from moisture and oxygen, and it is necessary to have better package of the OLED to prevent entry of moisture and oxygen. In order to keep atmospheric moisture and oxygen from affecting the OLED, in the conventional method for fabricating OLED display devices, a glass frit is applied on the inner surfaces of two substrates, and the OLED display device is pre-heated to 500° C. to combine the two substrates.

However, if the frit is damaged due to external force impact or other factors, oxygen or moisture will enter the OLED display device along the fracture of the frit or the crack between the frit and the two substrates, which may cause the failure of the OLED elements. Therefore, this issue should be resolved for developing a better OLED display device and fabricating method for the same.

SUMMARY

In light of the foregoing, one of the disclosed embodiments is to provide an OLED display device with better reliability.

In one exemplary embodiment, the OLED display device includes a first substrate, a second substrate, a frit, and a metal layer. The second substrate is arranged to be separated from the first substrate. The frit is located between the first and second substrates. The metal layer is disposed on the first substrate, and the frit is located on the metal layer. The metal layer includes at least one opening. The frit is located in the opening. The frit has a number of voids arranged to correspond to the opening.

In the above embodiment, some of the voids are arranged to correspond to the edge of the opening.

In the above embodiment, the metal layer has a convex-concave edge, and some of the voids are arranged to correspond to the convex-concave edge.

In the above embodiment, most of the voids are arranged at a middle region of the frit in a width direction.

In the above embodiment, the diameter of each of the voids is in a range of 4 um to 10 um.

In the above embodiment, a portion of the frit is located in the opening.

In another exemplary embodiment, the organic light-emitting diode display includes a first substrate, a second substrate, a frit, a metal layer, and an insulating layer. The second substrate is arranged to be separated from the first substrate. The frit is located between the first and second substrates. The metal layer is disposed on the first substrate, and the frit is located on the metal layer. The metal layer includes at least one opening. The frit is located in the opening. The frit has a number of voids arranged to correspond to the opening.

In the above embodiment, the width of the second opening of the insulation layer is in a range of 5 um to 12 um.

In the above embodiment, the width of the first opening of the metal layer is in a range of 30 um to 70 um.

In the above embodiment, the diameter of each of the voids is in a range of 4 um to 10 um.

In the above embodiment, a portion of the frit is located in the second opening.

In the disclosure, by arranging a number of voids in the frit connecting two substrates, the structural strength of the frit is improved. Therefore, if the frit is damaged due to impact or other factors, oxygen or moisture is still stopped by the frit from entering the OLED display device, and the reliability is enhanced and the life time of the display device is prolonged.

BRIEF DESCRIPTION OF THE DRAWINGS

The present invention can be more fully understood by reading the subsequent detailed description and examples with references made to the accompanying drawings, wherein.

DETAILED DESCRIPTION

Figure 1:
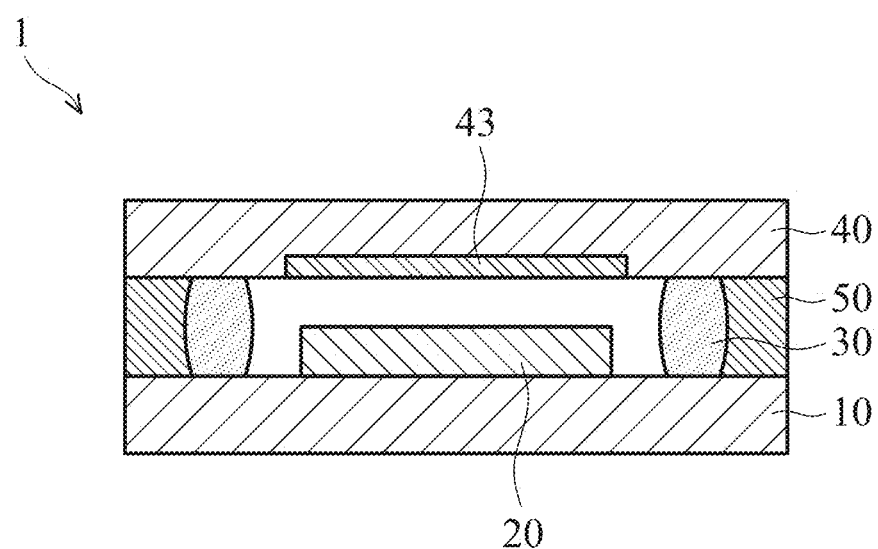
FIG. 1 shows a schematic view of an OLED display device 1 of an embodiment of the present disclosure.

The OLED display device of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments.

In this specification, relative expressions are used. For example, "lower", "bottom", "higher" or "top" are used to describe the position of one element relative to another. It should be appreciated that if a device is flipped upside down, an element at a "lower" side will become an element at a "higher" side.

The terms "about" and "substantially" typically mean +/−20% of the stated value, more typically +/−10% of the stated value and even more typically +/−5% of the stated value. The stated value of the present disclosure is an approximate value. When there is no specific description, the stated value includes the meaning of "about" or "substantially".

FIG. 1 shows an OLED (organic light-emitting diode) display device 1 of an embodiment of the present disclosure. In the embodiment, the OLED display device 1 includes a first substrate 10, an OLED layer 20, a frit 30, a second substrate 40 and a sealant 50. It should be appreciated that the numbers of elements of the OLED display device 1 may be added or eliminated but not limited thereto.

In the embodiment, the first substrate 10 is a transparent glass substrate. The first substrate 10 may be formed of a transparent glass material including silicon dioxide (SiO2). The material of the first substrate 10 is not limited thereto.

Figure 2:
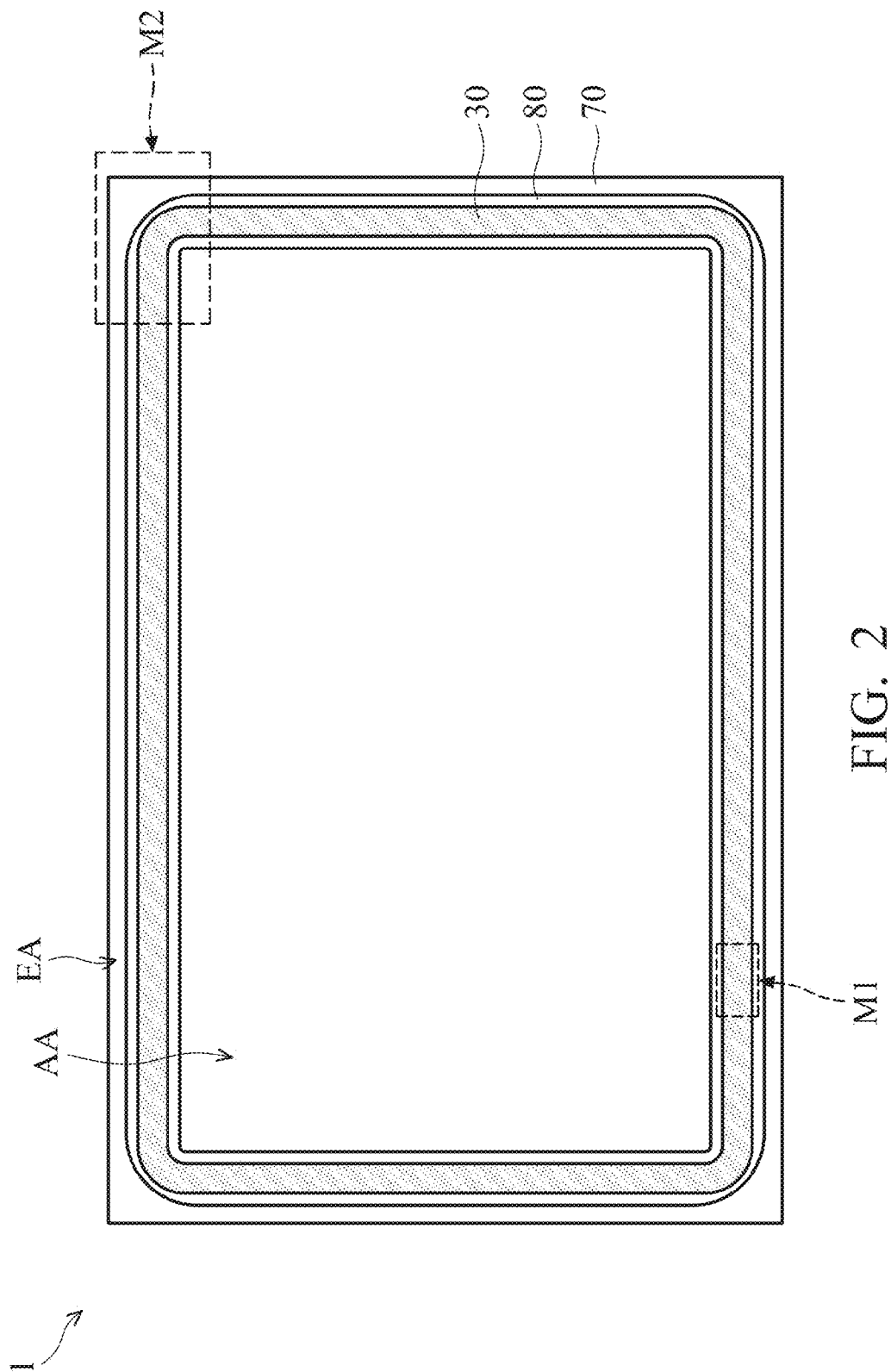
FIG. 2 shows a top view of some elements of the OLED display of some embodiments.

As shown in FIG. 2, the first substrate 10 is divided into a display area AA and an edge area EA. The edge area EA completely surrounds an outer side of the display area AA. The OLED layer 20 is arranged in the display area AA and formed on the first substrate 10. The OLED layer 20 is not formed on the edge area EA. In the embodiment, the OLED layer 20 emits white light. In the other embodiment, the OLED layer may emit primary colors of light, red, green and blue (RGB) or any other color of light.

FIG. 2 shows a top view of some elements of the OLED display of some embodiments. Referring to FIGS. 1 and 2, in the embodiment, the OLED display 1 further includes an insulation layer 70 and a metal layer 80. The metal layer 80 is arranged to correspond to an edge area EA of the first substrate 10 and is formed on the first substrate 10. At least a portion of the insulation layer 70 is arranged to correspond to an edge area EA of the first substrate 10 and is covered on the metal layer 80. The insulation layer 70 may extend from the display area AA to the edge area EA and terminate at the outermost edge of the first substrate 10. The insulation layer 70 may be formed on the first substrate 10 and manufactures with other insulation layer (such as buffer layer or gate insulating layer) in the display area AA at the same time.

The frit 30 is arranged to correspond to the edge area EA and disposed on the insulation layer 70 and the metal layer 80. In addition, the frit 30 surrounds the outer side of the OLED layer 20 and encircles the OLED layer 20. The structural features of the frit 30, the insulation layer 70, and the metal layer 80 are described in the descriptions below.

Referring again to the FIG. 1, the second substrate 40 is connected to the first substrate 10 via the frit 30, and the second substrate 40 is arranged to be separated from the first substrate 10. In the embodiment, the second substrate 40 includes a color filter 43. The second substrate 40 faces the first substrate 10 and is connected to the frit 30. The OLED layer 20 is disposed in a space defined by the first substrate 10, the frit 30 and the second substrate 40.

In the embodiment, a spacing having a height of about 2 um to about 10 um is formed between the first and second substrates 10 and 40. In another embodiment, if the color of light emitted from the OLED layer is white, the second substrate 40 may simply, for example, be a dummy glass (not shown in the figure) without a color filter formed thereon and a color filter formed on the first substrate 10, but it should not be limited thereto. In still another embodiment, if the OLED layer emits primary colors of light, red, green and blue (RGB) or any other color of light, the second substrate 40 may also simply be a dummy glass (not shown in the figure) without a color filter formed thereon. The second substrate may also be made of metal material or plastic material.

The sealant 50 is disposed at the outermost position of the OLED display device 1. In the embodiment, the sealant 50 is applied between the first and second substrates 10 and 40 and is located at an outer side of the frit 30. In the embodiment, the sealant 50 may be UV glue.

Figure 3:
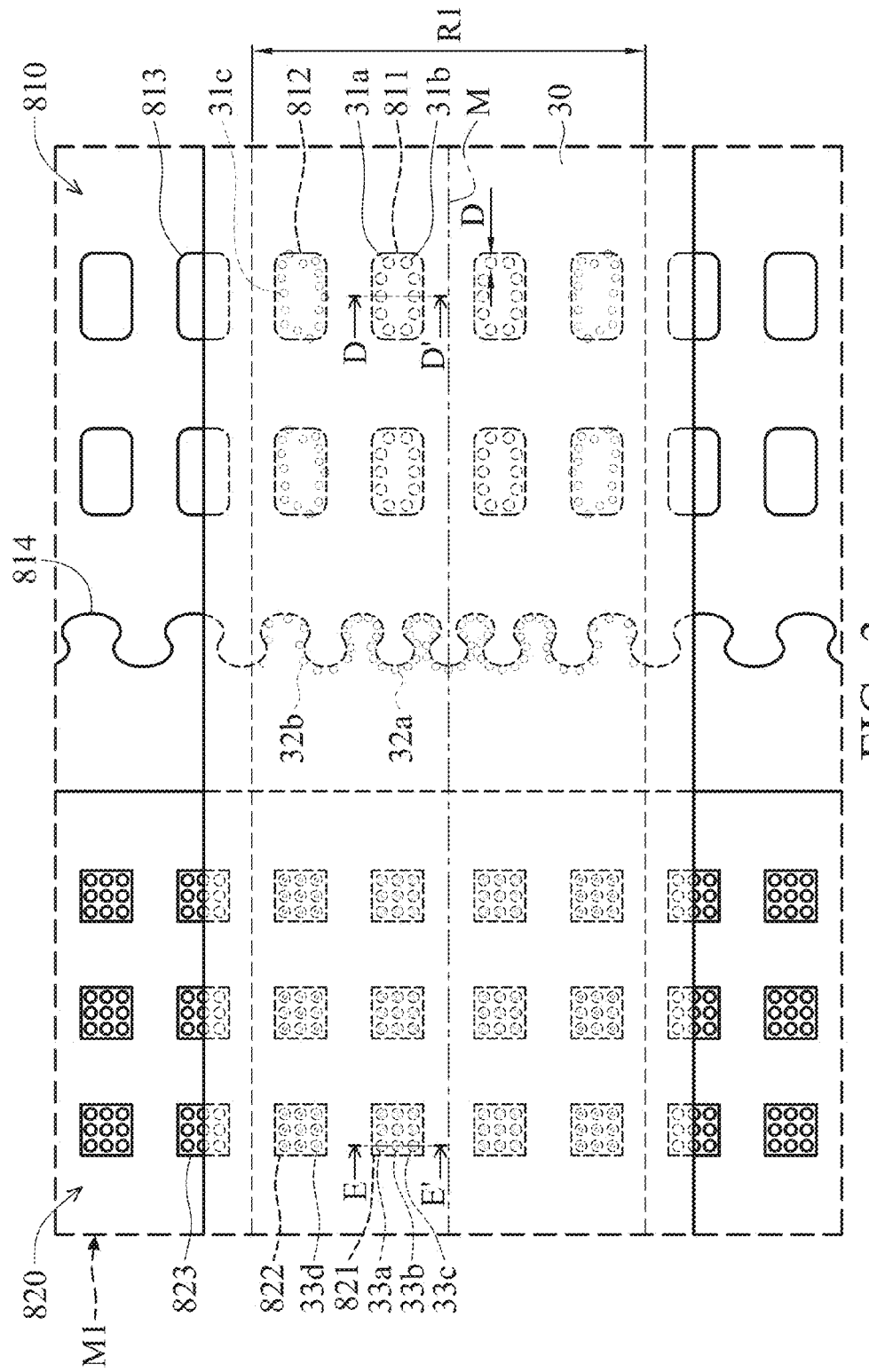
FIG. 3 shows an enlarged view of a region M1 shown in FIG. 2.

FIG. 3 shows an enlarged view of a region M1 shown in FIG. 2. In the embodiment, the region M1 shown in FIG. 3 is located adjacent to a terminal portion of the OLED display device 1. The terminal portion includes a number of metal traces connected the circuits in the display area AA to the driving circuits (not shown in the figures). However, the disclosure should not be limited to the embodiment. The region M1 can be any region in the OLED display device 1.

In the embodiment, as shown in FIG. 3, the metal layer 80 is patterned. For example, the metal layer 80 includes a first pattern 810 and a second pattern 820. The frit 30 is continuously supplied along a central line M and blankets on the first pattern 810 and the second pattern 820.

In the embodiment, a predetermined region R1 is defined at two sides of the central line M. In a direction perpendicular to the central line M, a ratio of the width of the predetermined region R1 and the width of the frit 30 is in a range of 0.3 to 0.6. In the predetermined region R1, the frit 30 has a number of voids. The voids are arranged to prevent stress from being concentrated in a specific position. As a result, the entry of oxygen or moisture to the OLED display device due to damage to the frit 30 can be avoided. The arrangement of the voids in the frit 30 is described below.

In the embodiment, the voids of the frit 30 are arranged to correspond to the openings of the first pattern 810 and the convex-concave edge 814 that are located in the predetermined region R1. No voids are arranged to correspond to the openings of the first pattern 810 and the convex-concave edge 814 that is located outside the predetermined region R1.

For example, as shown in FIG. 3, in the first pattern 810, the first pattern 810 includes a number of openings, such as openings 811, 812, and 813, arranged in a matrix form. The openings 811, 812, and 813 are arranged in a direction away from the central line M, wherein the openings 811 and 812 are located in the predetermined region R1, and the opening 813 is located outside the predetermined region R1.

The frit 30 includes a number of voids, such as voids 31a, 31b, and 31c, having a diameter greater than 3 um, wherein the voids 31a and 31b are arranged to correspond to the edge of the opening 811, and the void 31c is arranged to correspond to the edge of the opening 812. In the frit 30, there is almost no void having a diameter greater than 3 um to arrange in the opening 813 located outside the predetermined region R1. Moreover, the diameter D of one void means the minimum width in top view (e.g. FIG. 3).

In addition, voids such as the voids 32a and 32b are arranged to correspond to the convex-concave edge 814. The arrangement of the voids relative to the openings of the first pattern is elaborated in the description relating to FIG. 4.

Figure 4:
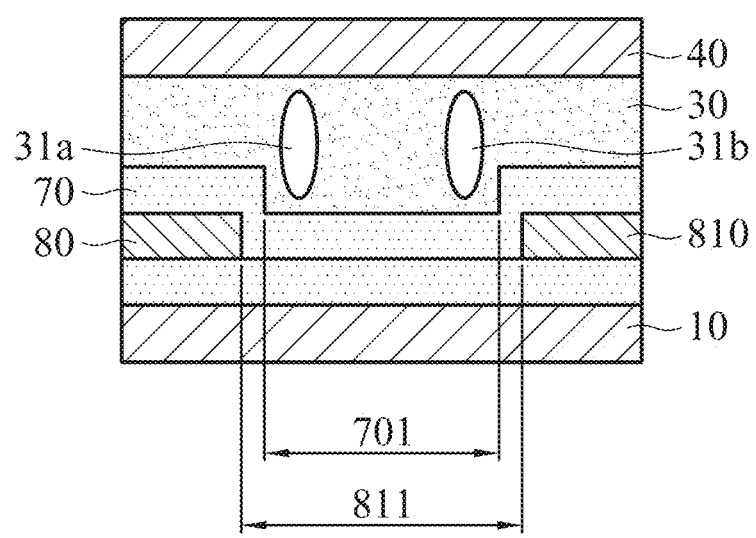
FIG. 4 shows a cross-sectional view taken along line D-D' of FIG. 3.

FIG. 4 shows a cross-sectional view taken along line D-D' of FIG. 3. In the embodiment, the voids 31a and 31b are arranged at the edge of the opening 811, and the voids 31a and 31b has a similar size and shape, however the disclosure should not be limited thereto. The voids 31a and 31b may be arranged at the edge of the opening 811 in an asymmetric manner relative to the center of the opening 811. Alternatively, the voids 31a and 31b have different sizes and shapes.

In the embodiment, a recess defined by the insulation layer 70 is located in each of the openings of the first pattern 810 of the metal layer 80. For example, as shown in FIG. 4, in the opening 811 of the first pattern 810, a recess 701 is formed by the insulation layer 70, wherein the recess 701 is located in the opening 811. In the embodiment, the width of the opening 811 of the first pattern 810 is in a range of 30 um to 60 um. The width of the recess 701 is slightly smaller than the width of the opening 811. That is, the recess 701 is located in the opening 811.

In the embodiment, as shown in FIG. 4, the frit 30 is supplied into the recess 701, and the voids 31a and 31b are not in contact with the inner wall of the recess 701. There is some frit 30 formed on the inner wall of the recess 701. However, the disclosure should not be limited thereto. In some other non-illustrated embodiments, the voids 31a and 31b are in contact with the inner wall of the recess 701, there is no frit 30 formed on a portion of the inner wall of the recess 701.

It should be appreciated that, in the embodiment shown in FIG. 4, while the projections of the voids 31a and 31b in a vertical direction are completely located within the opening 811 of the first pattern 810, the disclosure is not limited thereto. As shown in FIG. 3, a portion of the projections of the voids 31a and 31b in a vertical direction is located outside the opening 812 of the first pattern 810.

As shown in FIG. 3, in the embodiment, there are two or more voids in each of the openings 811 and 812. The voids are arranged substantially around a center of each of the corresponding openings 811 and 812. Additionally, the numbers of the voids arranged to correspond to the opening 811 is greater than that of the voids arranged to correspond to the opening 812, because that the opening 811 is nearer the central line M than the opening 812. And, the density of distribution of the voids arranged to correspond to the opening 811 is greater than that of the voids arranged to correspond to the opening 812. Moreover, the mean size of the voids corresponding to the opening 811 is larger than that of the voids arranged to correspond to the opening 812. For examples, the size of the voids 31a and 31b is larger than that of the void 31c.

Still referring to FIG. 3, in the embodiment, the voids in the frit 30 is arranged to correspond to the openings defined in the second pattern 820 which is located in the predetermined region R1.

For example, as shown in FIG. 3, a number of openings, such as the openings 821, 822, and 823, arranged in a matrix form are defined at the second pattern 820. The openings 821, 822, and 823 are arranged in a direction away from the central line M, wherein the openings 821 and 822 are located in the predetermined region R1, and the opening 823 is located outside the predetermined region R1.

The frit 30 includes a number of voids, such as voids 33a, 33b, 33c, and 33d, having a diameter greater than 3 um, wherein the voids 33a, 33b and 33c are arranged to correspond to the opening 821, and the void 31d is arranged to correspond to the opening 822. In the frit 30, there are almost no voids having a diameter greater than 3 um and arranged to correspond to the opening 823 located outside the predetermined region R1. The arrangements of the voids relative to the openings of the second pattern are elaborated in the description relating to FIG. 5.

Figure 5:
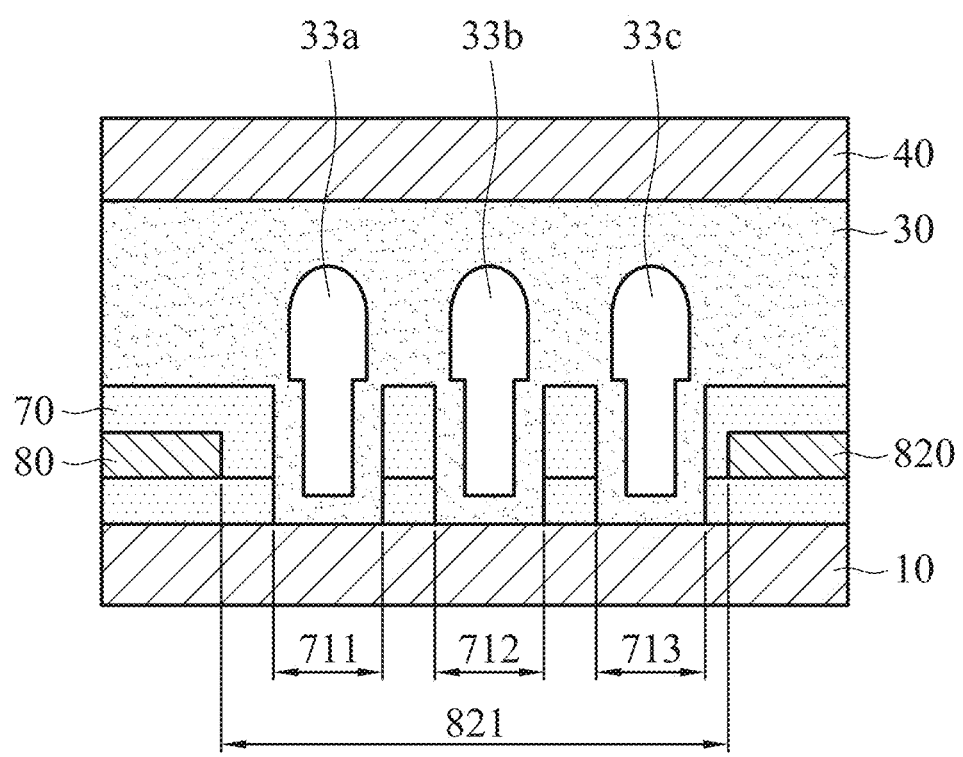
FIG. 5 shows a cross-sectional view taken along line E-E' of FIG. 3.

FIG. 5 shows a cross-sectional view taken along line E-E' of FIG. 3. In the embodiment, a number of openings (e.g. openings 711~713) that are defined by the insulation layer 70 are located in each opening (e.g. opening 821) that is defined by the second pattern 820 of the metal layer 80. For example, as shown in FIG. 5, in the opening 821 of the second pattern 820, a number of openings, such as openings 711, 712, and 713 are defined by the insulation layer 70, wherein the openings 711, 712, and 713 are located in the opening 821.

In the embodiment, the width of the opening defined by the second pattern 820 of the metal layer 80 is in a range of 30 um to 60 um, and the width of the opening defined by the insulation layer 70 is in a range of 5 um to 12 um, but the disclosure should not be limited thereto. For the purpose of clarity, in the following descriptions, the opening defined by the second pattern of the metal layer is referred to as the "first opening", and the opening defined by the insulation layer and located in the opening of the second pattern is referred to as the "second opening".

As shown in FIG. 5, in the embodiment, the voids 33a, 33b and 33c are arranged to correspond to the second openings 711, 712, and 713 that are located in the first opening 821. The frit 30 is supplied into the second openings 711, 712, and 713, and the voids 33a, 33b and 33c is not in contact with the inner wall of the second openings 711, 712, and 713. That is, there is some frit 30 formed on the inner wall of the second openings 711, 712, and 713. However, the disclosure should not be limited in the embodiment. In some other non-illustrated embodiments, the voids 33a, 33b and 33c are in contact with the inner walls of the second openings 711, 712, and 713. That is, a portion of the inner walls of the second openings 711, 712, and 713 is not covered by frit 30.

In the embodiment, the widths of the voids 33a, 33b and 33c are varied. For example, the widths of the voids 33a, 33b and 33c located outside the second openings 711, 712, and 713 are greater than the widths of the voids 33a, 33b and 33c located in the second openings 711, 712, and 713. In the embodiment, the widths of the voids are in a range of 4 um to 10 um. In the embodiment, the voids 33a, 33b and 33c has the same size and shape, but the disclosure should not be limited thereto. The voids 33a, 33b and 33c may have different sizes and shapes.

It should be appreciated that in the embodiment shown in FIG. 5, while the projections of the voids 33a, 33b and 33c in a vertical direction are completely located within the second openings 711, 712, and 713, but the disclosure is not limited thereto. A portion of the projections of the voids in a vertical direction may be located outside the second opening.

As shown in FIG. 3, in the embodiment, the average size of the voids corresponding to the opening 812 is larger than that of the voids arranged to correspond to the opening 822.

For examples, the size of the voids 33a, 33b, and 33c is larger than that of the void 33d. In addition, in some other embodiments, in the frit 30 there are no voids arranged to correspond to some second openings located in the predetermined region R1.

Figure 6:
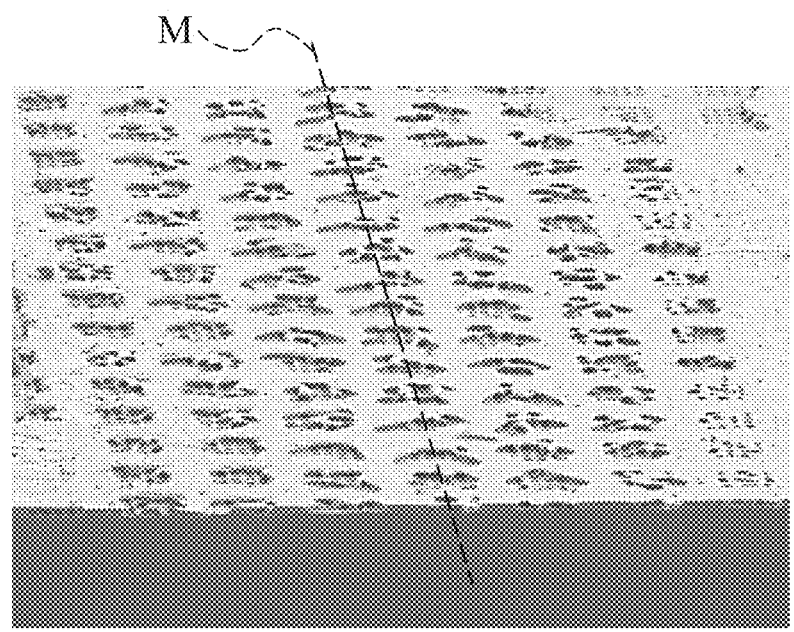
FIG. 6 shows a picture of a portion of the structure of the OLED display device observed by a microscope, wherein the density of the distribution of voids gradually decreases along two directions.
Figure 7:
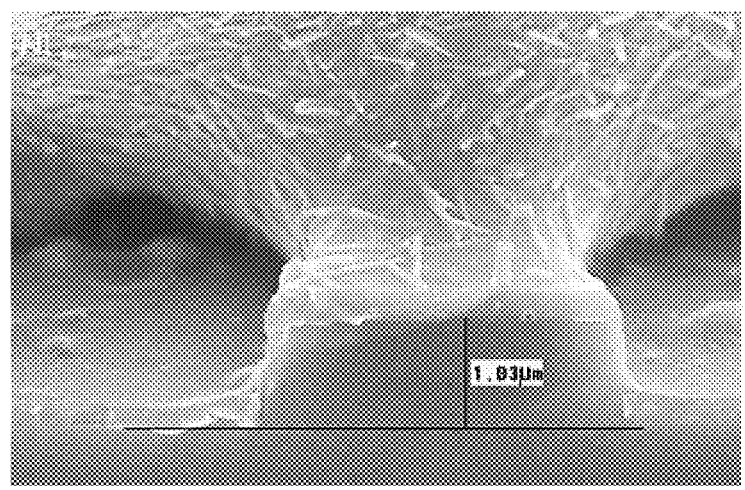
FIG. 7 shows a picture of a portion of the structure of the OLED display device observed by a microscope, wherein the voids are arranged to correspond to the opening of the metal layer.

FIG. 6 shows a picture of a portion of the structure of the OLED display device 1 observed by a microscope. As shown in FIG. 6, the density of the distribution of voids gradually decreases along a direction toward two sides of the central line M. FIG. 7 shows a picture of a portion of the structure of the OLED display device 1 observed by a microscope. As shown in FIG. 7, the voids are arranged to correspond to the opening of the metal layer, and the frit (the structure having the light color) is formed on the inner wall of the opening.

Figure 8:
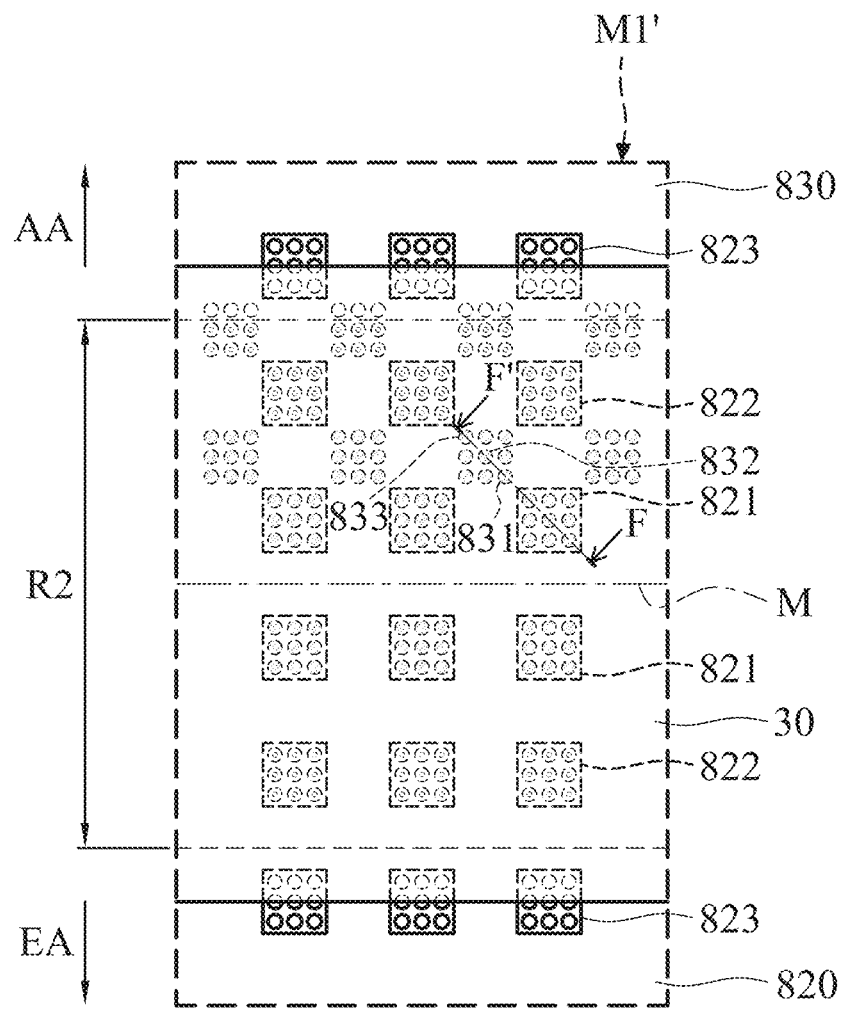
FIG. 8 shows an enlarged view of a portion region shown in FIG. 2.

The configuration in the region M1 of FIG. 2 should not be limited to the embodiment of FIG. 3. For example, the configuration in the region M1 can be replaced by the configuration in the region M1' shown in FIG. 8. In the embodiment, the region M1' is located adjacent to the terminal portion of the OLED device 1. The terminal portion includes a number of metal traces connecting the circuits in the display area AA to the driving circuits (not shown in the figures). However, the disclosure should not be limited to the embodiment. The region M1' can be any region of the OLED display device 1. In the embodiment, as shown in FIG. 8, the metal layer 80 includes a number of patterns, such as the second pattern 820 and a third pattern 830. The third pattern 830 and the second pattern 820 are arranged in order in a direction away from the display area AA. That is the second pattern 820 is farther away from the display area AA than the third pattern 830. In the embodiment, the second pattern 820 is arranged adjacent to the third pattern 830 and connected to the third pattern 830.

The frit 30 is continuously supplied along a central line M and blankets the second pattern 820 and the third pattern 830. In the embodiment, the boundary of the second pattern 820 and the third pattern 830 aligns with the central line M, but the disclosure should not be limited thereto. The boundary of the second pattern 820 and the third pattern 830 may be closer to the display area AA or the edge area EA than the central line M.

In the embodiment, differences between the second pattern 820 and the third pattern 830 include the third pattern 830 further including a number of micro openings arranged between two neighboring openings that are arranged along a direction that is inclined to the central line 45 degrees. In the embodiment, the group of micro opening consists of 9 micro openings, and each group of micro openings is arranged between the two neighboring openings, but the disclosure should not be limited thereto.

In the embodiment, a predetermined region R2 is defined at two sides of the central line M. In a direction perpendicular to the central line M, the ratio of the width of the predetermined region R2 and the width of the frit 30 is in a range of 0.3 to 0.6. In the predetermined region R2, the frit 30 has a number of voids. The voids are arranged to prevent stress from being concentrated in a specific position. As a result, the entry of oxygen or moisture to the OLED display device due to damage to the frit 30 resulting from impact or other factors can be avoided. The arrangement of the voids in the frit 30 is described below.

In the embodiment, the voids of the frit 30 are arranged to correspond to the openings of the second pattern 820, the third pattern 830, and the micro openings that are located in the predetermined region R2. No voids are formed corresponding to the openings of the second pattern 820, the third pattern 830, and the micro openings that are located outside the predetermined region R2.

Figure 9:
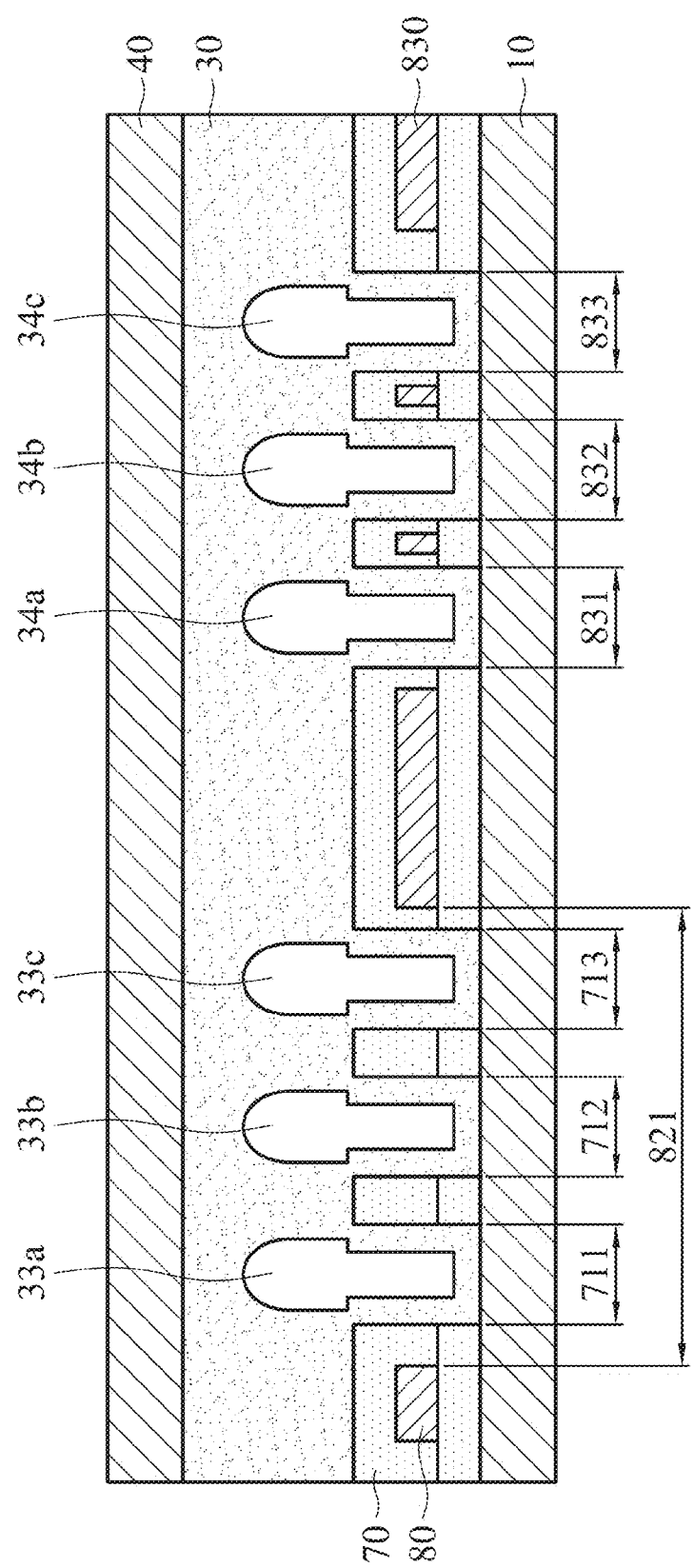
FIG. 9 shows a cross-sectional view taken along line F-F' of FIG. 8.

The arrangements of the voids and the micro openings of the third pattern are illustrated in the description referring to FIG. 9.

FIG. 9 shows a cross-sectional view taken along line F-F' of FIG. 8. In the embodiment, the third pattern 830 of the metal layer 80 includes a number of micro openings, such as the micro openings 831, 832, and 833.

The frit 30 has a number of voids, such as voids 34a, 34b, and 34c. The voids 34a, 34b, and 34c are arranged to correspond to the micro openings 831, 832, and 833. The frit 30 is supplied into the micro openings 831, 832, and 833, and the voids 34a, 34b, and 34c is not in contact with the inner walls of the micro openings 831, 832, and 833. That is, there is some frit 30 formed on the inner wall of the micro openings 831, 832, and 833. However, the disclosure should not be limited in the embodiments. In some other non-illustrated embodiments, the voids 34a, 34b, and 34c is in contact with the inner wall of the micro openings 831, 832, and 833. That is, a portion of the inner wall of the micro openings 831, 832, and 833 is not covered by the frit 30.

In the embodiment, the widths of the voids 34a, 34b, and 34c may vary. For example, as shown in FIG. 9, the widths of the voids 34a, 34b, and 34c located outside the micro openings 831, 832, and 833 are greater than the widths of the voids 34a, 34b, and 34c located in the micro openings 831, 832, and 833. In the embodiment, the widths of the voids are in a range of 4 um to 10 um. In the embodiment, the voids 34a, 34b, and 34c have the same size and shape, but the disclosure should not be limited thereto. The voids 34a, 34b, and 34c may have different sizes and shapes.

It should be appreciated that in the embodiment shown in FIG. 9, while the projections of the voids 34a, 34b, and 34c in a vertical direction are completely located within the micro openings 831, 832, and 833, the disclosure is not limited thereto. A portion of the projections of the voids in a vertical direction is located outside the opening of the micro openings.

Figure 10:
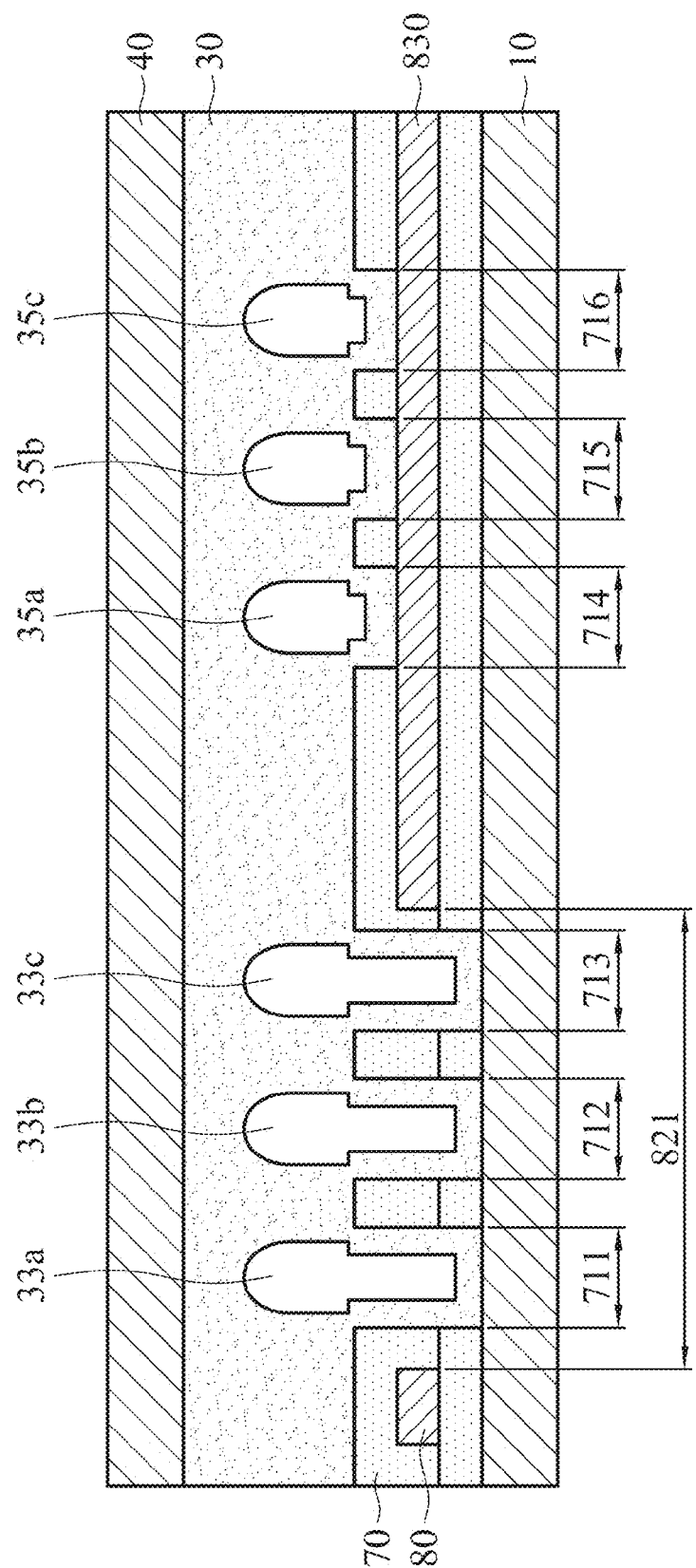
FIG. 10 shows a cross-sectional view of an OLED display device according to another embodiment of the disclosure.

The arrangements of the voids relative to the opening of the third pattern is similar to the arrangements of the voids relative to the opening of the second pattern shown in FIG. 5 and therefore is not described again for brevity. In the region M1', since the frit 30 has more voids in the region that is close to the display area AA, the problem of the frit 30 becoming damaged due to stress can be effectively prevented. FIG. 10 shows a cross-sectional view of an OLED display device according to another embodiment of the disclosure. Compared with the embodiment shown in FIG. 9, in FIG. 10, the micro openings 831, 832, and 833 of the metal layer 80 are omitted. In addition, the frit 30 further includes a number of voids, such as voids 35a, 35b, and 35c, arranged above the metal layer 830.

In the embodiment, the voids 35a, 35b, and 35c are arranged to correspond to the opening 714, 715, and 716. The frit 30 is supplied into the opening 714, 715, and 716, and the voids 35a, 35b, and 35c are not in contact with the inner walls of the openings 714, 715, and 716. That is, there is some frit 30 formed on the inner wall of the opening 714, 715, and 716. However, the disclosure should not be limited in the embodiments. In some other non-illustrated embodiments, the voids 35a, 35b, and 35c are in contact with the inner wall of the opening 714, 715, and 716. That is, a portion of the inner wall of the opening 714, 715, and 716 is not covered by the frit 30.

In the embodiment, the widths of the voids 35a, 35b, and 35c are varied. For example, as shown in FIG. 10, the widths of the voids 35a, 35b, and 35c located outside the opening 714, 715, and 716 are greater than the widths of the voids 35a, 35b, and 35c located in the opening 714, 715, and 716. In the embodiment, the widths of the voids are in a range of 4 um to 10 um. In the embodiment, the voids 35a, 35b, and 35c have the same size and shape, however the disclosure should not be limited thereto. The voids 35a, 35b, and 35c may have different sizes and shapes.

It should be appreciated that in the embodiment shown in FIG. 10, while the projections of the voids 35a, 35b, and 35c in a vertical direction are completely located within the micro openings 714, 715, and 716, the disclosure is not limited thereto. A portion of the projections of the voids 35a, 35b, and 35c in a vertical direction is located outside the openings.

Figure 11:
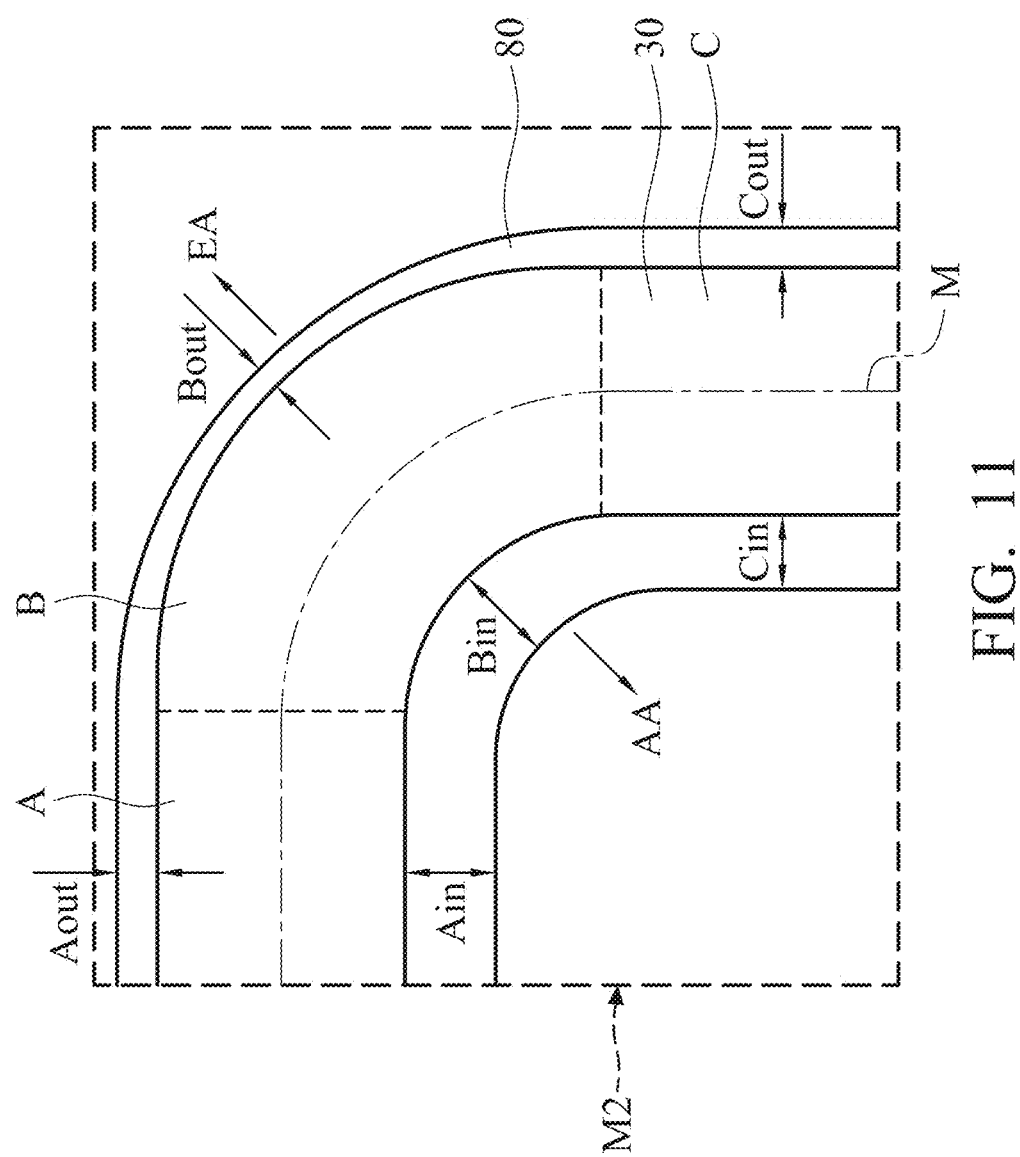
FIG. 11 shows an enlarged view of a region M2 shown in FIG. 2.

FIG. 11 shows a magnified view of region M2. In the embodiment, the region M2 shown in FIG. 11 is adjacent to a corner of two lateral sides of the OLED display device 1.

In the embodiment, the distance between the frit 30 and the edge of the metal layer 80 may vary. Specifically, as shown in FIG. 11, in the region M2, the frit 30 has a section A, a section B, and a section C. The section A is arranged parallel to the upper bezel of the OLED display device 1. The section C is arranged parallel to the right bezel of the OLED display device 1. The section B is curved and connects the section A to the section B.

In the section A, the distance between the frit 30 to the edge of the metal layer 80 that is away from the display area AA is indicated by Aout, and the distance from the frit 30 to the edge of the metal layer 80 that is close to the display area AA is indicated by Ain. In the section B, the minimum distance from the frit 30 to the edge of the metal layer 80 that is away from the display area AA is indicated by Bout, and the maximum distance from the frit 30 to the edge of the metal layer 80 that is close to the display area AA is indicated by Bin. In the section C, the distance from the frit 30 to the edge of the metal layer 80 that is away from the display area AA is indicated by Cout, and the distance from the frit 30 to the edge of the metal layer 80 that is close to the display area AA is indicated by Cin. In the embodiment, the frit 30 and the edge of the metal layer 80 are arranged according to the following equations:

$$Bin/Bout > Ain/Aout; \text{ and}$$

$$Bin/Bout > Cin/Cout$$

Through the above features, the voids in the frit are arranged in a position that is close to the outer edge of the metal layer 80, such that the structural strength of the frit 30 in the specific region is enhanced. Therefore, the reliability of the OLED display device is improved.

The OLED display device of the disclosure utilizes the frit 30 to block moisture and oxygen in the atmosphere providing a significant reduction in water vapor transmission rate (WVTR). Moreover, by arranging a number of voids in the frit 30, the structural strength of the frit 30 is enhanced. As a result, damage to the frit 30 can be prevented, and the life time of the OLED display device is increased accordingly.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An organic light-emitting diode display, comprising:
a first substrate;
a second substrate, arranged to be separated from the first substrate;
a frit, arranged between the first and second substrates; and
a metal layer, disposed on the first substrate, wherein the frit is located on the metal layer, and the metal layer has at least one opening, and a portion of the frit is located in the opening;
wherein the frit comprises a plurality of voids, and some of the voids are arranged to correspond to the opening of the metal layer.

2. The organic light-emitting diode display as claimed in claim 1, wherein some of the voids are arranged to correspond to the edge of the opening.

3. The organic light-emitting diode display as claimed in claim 1, wherein the metal layer has a convex-concave edge, and some of the voids are arranged to correspond to the convex-concave edge.

4. The organic light-emitting diode display as claimed in claim 1, wherein the voids are arranged in a middle region in a width direction of the frit.

5. The organic light-emitting diode display as claimed in claim 1, wherein the diameter of each of the voids is in a range of 4 um to 10 um.

6. An organic light-emitting diode display, comprising:
a first substrate;
a second substrate, arranged to be separated from the first substrate;
a frit, arranged between the first and second substrates;
a metal layer, disposed on the first substrate, wherein the frit is located on the metal layer, and the metal layer has at least one first opening; and
an insulation layer, located on the metal layer and having a plurality of second openings located in the first opening, wherein the frit is located on the insulation layer and a portion of the frit is located in the second openings ;
wherein the frit comprises a plurality of voids, and the voids are arranged to correspond to the second opening.

7. The organic light-emitting diode display as claimed in claim 6, wherein the width of one of the second openings of the insulation layer is in a range of 5 um to 12 um.

8. The organic light-emitting diode display as claimed in claim 6, wherein the width of the first opening of the metal layer is in a range of 30 um to 60 um.

9. The organic light-emitting diode display as claimed in claim 6, wherein the diameter of each of the voids corresponding to the second openings is in a range of 4 um to 10 um.

10. The organic light-emitting diode display as claimed in claim 6, wherein the metal layer has a convex-concave edge, and some of the voids are arranged to correspond to the convex-concave edge.

* * * * *